United States Patent
Balteanu et al.

(10) Patent No.: US 6,704,560 B1
(45) Date of Patent: Mar. 9, 2004

(54) LOW-VOLTAGE TRANSCONDUCTANCE AMPLIFIER/FILTERS

(75) Inventors: Florinel Balteanu, Ottawa (CA); James Cherry, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 469 days.

(21) Appl. No.: 09/676,597

(22) Filed: Sep. 29, 2000

(30) Foreign Application Priority Data

Feb. 9, 2000 (CA) .............................................. 2298310

(51) Int. Cl.⁷ ................................................ H04B 1/38
(52) U.S. Cl. ........................ 455/333; 330/257; 330/259
(58) Field of Search ................................ 330/257, 288, 330/253, 259; 327/538, 563; 455/333

(56) References Cited

U.S. PATENT DOCUMENTS

| | | | |
|---|---|---|---|
| 5,212,458 A | 5/1993 | Fitzpatrick et al. | 330/288 |
| 5,442,318 A * | 8/1995 | Badyal et al. | 330/253 |
| 5,444,414 A | 8/1995 | Delano | 327/563 |
| 5,451,898 A * | 9/1995 | Johnson | 327/563 |
| 5,451,901 A | 9/1995 | Welland | 330/133 |
| 5,844,442 A | 12/1998 | Brehmer | 330/258 |

FOREIGN PATENT DOCUMENTS

| | | | |
|---|---|---|---|
| EP | 62227204 | 6/1987 | H03F/3/45 |
| EP | 0616423 A1 | 9/1994 | H03F/3/45 |

OTHER PUBLICATIONS

Willingham et al., "BiCMOS Components for Video–Rate Continuous–Time Filters," 1992 IEEE International Symposium on Circuits and Systems, vol. 6, May 10–13, 1992, pp. 2691–2694.

Fenk et al., "Low–noise, low–voltage, low–power IF gain controlled amplifiers for wireless communication," J.C. Balzer AG, Science Publishers, Wireless Networks 4 (1998), pp. 87–97.

Crols et al., "Low–IF Topologies for High–Performance Analog Front Ends of Fully Integrated Receivers," IEEE Transactions on Circuits and Systems–II: Analog and Digital Processing, vol. 45, No. 3, Mar. 1998, pp. 269–282.

Crawley, et al., "Designing Operational Transconductance Amplifiers for Low Voltage Operation," IEEE International Symposium on Circuits and Systems, Chicago, Ill, May, 1993, pp. 1455–1458.

* cited by examiner

*Primary Examiner*—Lee Nguyen
(74) *Attorney, Agent, or Firm*—Gardner Groff, P.C.

(57) ABSTRACT

Wireless communications devices must handle a wide range of useful signal levels and must also cope with large interfering signals of nearby frequencies. They often use transconductance amplifiers/filters as building blocks as such amplifier/filters exhibit good characteristics of both amplification and filtering. The transconductance cells described make use of feedbacks which involve no signal conversions. As the result, the cells have high linearity and yet can operate at low voltage.

8 Claims, 9 Drawing Sheets

LOW-VOLTAGE TRANSCONDUCTANCE AMPLIFIER/FILTERS

FIELD OF INVENTION

The invention resides in the field of wireless communication devices and systems where a wide variety of signals need to be handled. In particular it relates to transconductance cells for amplifying/filtering wireless signals, which cells have a high linearity over a wide range of signal levels and yet require a low operational voltage.

BACKGROUND OF INVENTION

In typical applications, a wireless receiver must operate over a wide range of signal levels as well as large interfering signals. The interfering signals emanate from users in adjacent channels, as well as from transmission sources which may be relatively far removed in frequency but have a large transmission power. When two interfering signals at frequencies f1 and f2 (where f1 and f2 are close to the desired signal frequency) are present, they will produce—due to amplifier nonlinearity—intermodulation products at frequencies 2f2–f1 and 2f1–f2. These can fall at frequencies close to the desired signal frequency. The resulting interference causes measurable degradation of the bit error rate (BER) in digital communication systems.

The ability of circuits to handle large signals can be characterized by the third-order intercept point (IP3) which is a measure of circuit linearity. In most receivers, signal filtering circuits and variable gain control circuits are essential parts of signal processing to decode the transmitted information. These circuits often use transconductance amplifiers/filters as building blocks as they satisfy the requirements well. The transconductance amplifiers/filters are in the configuration of differential amplifiers and are also called simply differential amplifiers.

Following articles describe in detail requirements of wireless communication receivers and suggest some design principles of transconductance amplifier/filters.

[1] Fenk J. and Sehrig P.: "Low-noise, low-voltage, low-power IF gain controlled amplifiers for wireless communications," in *Analog Circuit Design,* Huijsing J. H. et al. (eds), 1996 *Kluwer Academic Publishers,* pp. 27–44.

[2] Crols J., Steyart M.: "Low-IF Topologies for High-Performance Analog Front Ends of Fully Integrated Receivers," *"IEEE Transactions on circuits and systems-II: Analog and digital signal processing,"* Vol. 45, No. 3, March 1998, pp. 269–282.

There is a further requirement however of these signal filtering and variable gain control circuits and that is that they must be powered at a very low voltage.

An article below describes cascaded current mirror circuits which permit low voltage operation of transconductance amplifiers.

[3] Crawley P. J., Roberts G. W.: "Designing Operational Transconductance Amplifiers For Low Voltage Operation" *"IEEE International Symposium on Circuits and systems"* Chicago, Ill., May 1993, pp. 1455–1458.

Following U.S. Patents describe a variety of transconductance amplifiers: U.S. Pat. No. 5,444,414 Aug. 22, 1995 Delano, U.S. Pat. No. 5,451,901 Sep. 19, 1995 Welland and U.S. Pat. No. 5,844,442 Dec. 1, 1998 Brehmer.

In spite of the prior art mentioned above, there are pressing needs to have a transconductance amplifier/filter that can operate at a low supply voltage and yet exhibit a high linearity. Some embodiments of the invention include a common mode feedback circuit used to bias the transconductance amplifier and/or a variable gain circuit to permit operation at a different gain settings.

In yet another embodiment, a complex filter cell includes four Gm transconductance cells to realize a complex pole filter. More poles can be realized using cascaded complex Gm cells. A wireless communications receiver including such filters is also described.

The specification will describe the invention and its advantages in full in connection with circuits which use bipolar transistors. It should, however, be noted that any active devices including e.g., MOS etc., can be used to implement the present invention to realize the advantages.

SUMMARY OF THE INVENTION

According to one aspect, there is provided a low voltage transconductance cell, having a high linearity. The cell comprises a transconductance core for differential inputs and differential outputs, current sources for providing operational currents for the transconductance core, current mirror circuits connected to the transconductance core for generating a pair of mirrored feedback currents to be fed back to the current sources, a bias circuit for setting an operational point of the transconductance core, and a common mode feedback circuit connected to the outputs of the transconductance core for generating a bias signal to be applied to the bias circuit. The common mode feedback circuit includes an averaging circuit for averaging the differential outputs and a comparing circuit for comparing an average of the differential outputs with a reference value to generate the bias signal.

According to a further aspect, there is provided a low voltage transconductance cell having a high linearity, which includes: a differential amplifier stage including a non-inverting section and an inverting section the non-inverting section having a non-inverting input and a non-inverting output and the inverting section having an inverting input and an inverting output; first and second current sources generating a current flow through the non-inverting section and the inverting section respectively; first current mirror and second current mirror circuits connected to the non-inverting and inverting sections respectively, the first current mirror circuit sensing the current in the non-inverting section and generating a first mirror current to feed back to the second current source, and the second current mirror circuit sensing the current in the inverting section and generating a second mirror current to feed back to the first current source.

DETAILED DESCRIPTION OF PREFERRED EMBODIMENTS OF INVENTION

Figure 1:
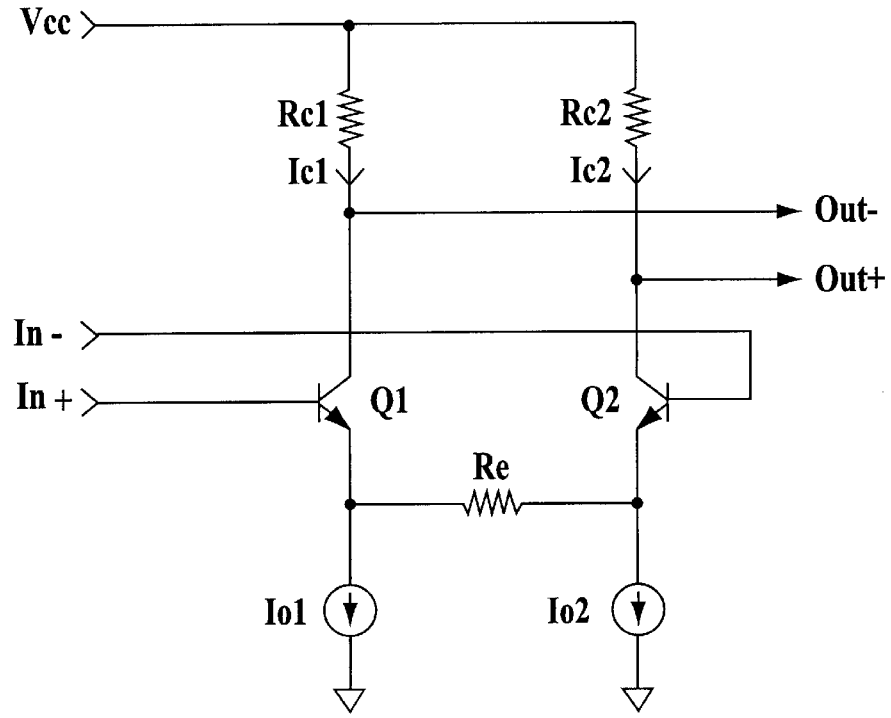
FIG. 1 is a schematic diagram of a basic transconductance cell.

FIG. 1 presents a transconductance cell known in the art. The cell includes a transconductance core consists of two transistors Q1, Q2, that are coupled to differential inputs In+ and In−. A degeneration resistor Re couples the emitters of transistors Q1 and Q2 to the current sources Io1 and Io2. This degeneration resistor improves the third order intercept point IP3 of the cell. In the field of wireless communication devices, the incoming signals can be radio frequency (RF) or intermediate frequency (IF) signals. The incoming signal is present at the input ports, In+ and In− as a differential (balanced) voltage signal. The differential signal consists of a non-inverted and an inverted signal. The differential voltage signal is converted and amplified using the transistors Q1 and Q2 into two differential currents Ic1 and Ic2. The device that converts a voltage signal into a current signal and amplifies this signal before presenting an amplified voltage signal is called transconductance cell. The resistors Rc1 and Rc2 are used for converting current information into voltage information and to present the information at the output ports Out− and Out+ as differential output voltage signal which consists of a non-inverted and inverted output signal.

Figure 2:
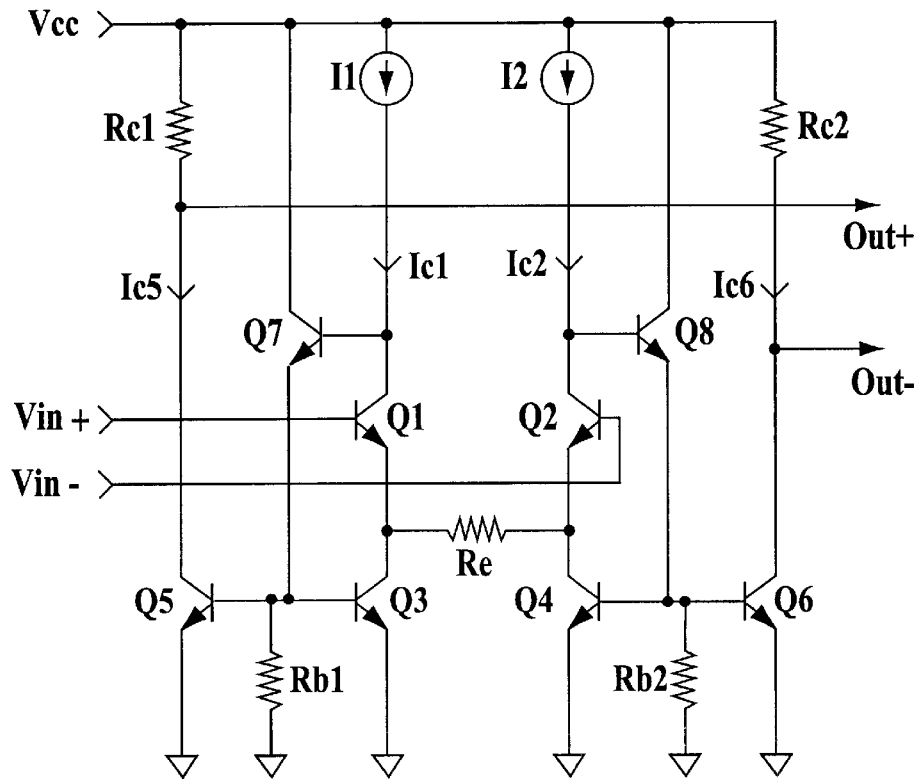
FIG. 2 is a schematic diagram of a feedback transconductance cell.

FIG. 2 shows an improved transconductance cell known in the art. The transconductance cell includes transistors Q1 and Q2 and feedback transistors Q7 and Q8. A degeneration resistor Re couples the emitters of transistors Q1 and Q2 and it improves linearity as in the case of FIG. 1. These emitters are also coupled to the collectors of transistors Q3 and Q4 which act as current sources for the input differential transistor pair Q1 and Q2. The incoming voltage signal present at input ports Vin+ and Vin− is converted into two currents Ic1 and Ic2 by the differential transistor pair formed by Q1 and Q2, is amplified and is converted again into a differential voltage signal present between the bases of transistors Q7 and Q8. This voltage is transferred through the base-emitter junctions of transistors Q7 and Q8 into two voltages present at resistors Rb1 and Rb2. The voltage signals on resistors Rb1 and Rb2 are applied to the bases of transistors Q3 and Q4, which then feed these signals into the emitters of input transistors Q1 and Q2. Therefore, this circuit contains a feedback path; the input goes to Q1 and Q2, through Q7 and Q8 to Rb1 and Rb2, through Q3 and Q4 and back to Q1 and Q2. This feedback of the amplified signal provides a further improvement to the linearity of the transconductance cell. The output signal is developed through transistors Q5 and Q6 and with Q3 and Q4, they sense the voltage at Rb1 and Rb2, and convert output current information into two output currents Ic5 and Ic6. The resistors Rc1 and Rc2 convert output current information into output voltage information and present the information at the output port Out+ and Out− as a differential output voltage signal consisting of a non-inverted and inverted output signal.

It should be noted that in the foregoing figures and any figures which may follow, same or like designations indicate same or like components. Therefore, for example, transistors Q1 and Q2 in both FIGS. 1 and 2 are components which perform similar functions.

Figure 3:
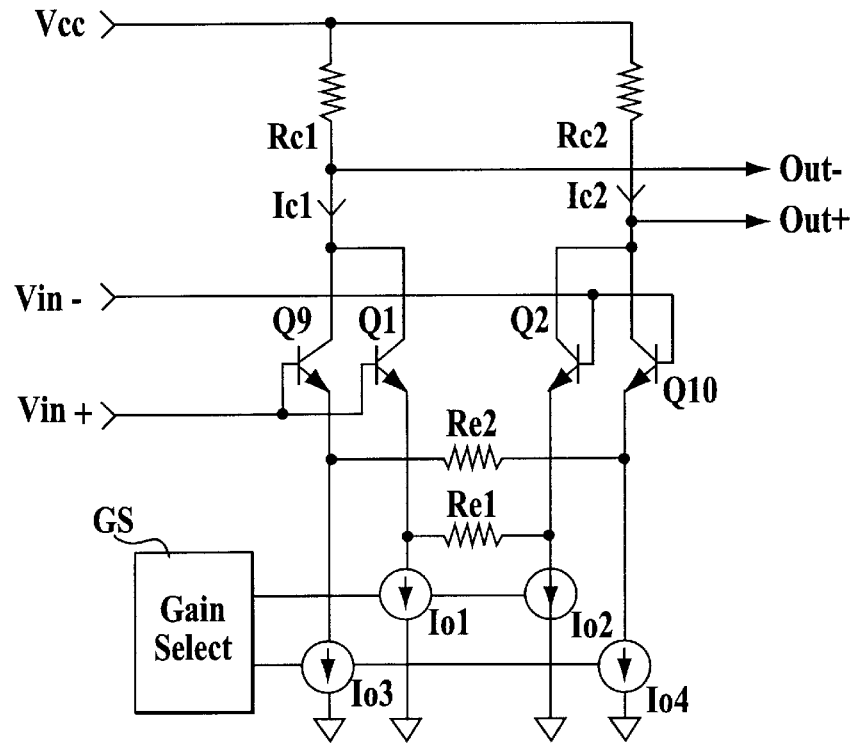
FIG. 3 is a schematic diagram of a variable gain transconductance cell.

FIG. 3 illustrates a dual-gain emitter-coupled differential variable gain amplifier. In this circuit, the input transistor pair Q1 and Q2 with degeneration resistor Re1, and also the transistor pair Q9 and Q10 with the resistor Re2 act as two transconductance cores as presented in FIG. 1. Each of two cores converts the input signal into a differential current. A gain select block GS controls which transconductance core is active by activating either the current sources Io1 and Io2 for the transistor pair Q1 and Q2 or the current sources Io3 and Io4 for the transistor pair Q9 and Q10. The resistors Rc1 and Rc2 convert the differential current information Ic1 and Ic2 into a differential output voltage at the output ports Out+ and Out− as a differential output signal consisting of a non-inverted and inverted output signal.

Figure 4:
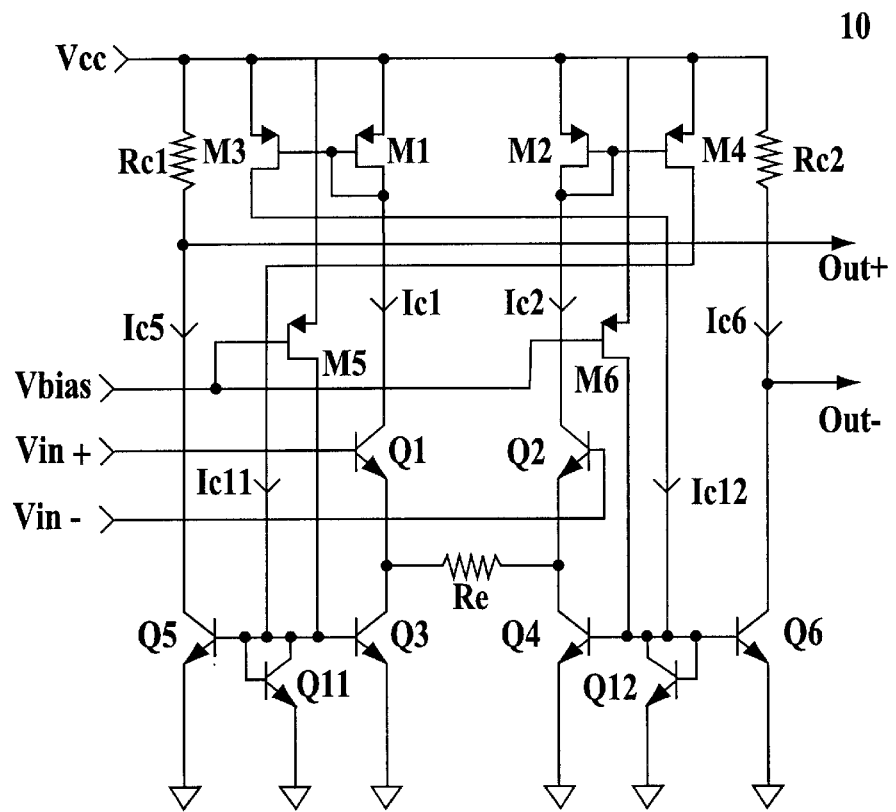
FIG. 4 is a schematic diagram showing a practical transconductance cell implementation in accordance with one embodiment of the present invention.

In FIG. 4 a schematic diagram showing a practical transconductance implementation in accordance with one embodiment of the present invention is presented. This implementation has at least two distinct advantages over the prior art presented in FIG. 2. First, in FIG. 2, the intermediate currents Ic1 and Ic2 are converted to a voltage which modulates Rb1 and Rb2; the new transconductance cell in FIG. 4 has no intermediate conversion from current into voltage. Keeping the signal entirely in the current domain provides better linearity. Second, the structure in FIG. 2 exhibits two series base-emitter junctions at Q7 and Q3 (or two gate-source junctions if the circuit were built using MOS rather than bipolar transistors) between the positive power supply and ground. FIG. 4 does not exhibit this trait, permitting it to be used at a lower power supply voltage.

Referring to FIG. 4, the input differential transistor pair Q1 and Q2 with degeneration resistor Re converts the input signal present at input ports Vin+ and Vin− into a differential current represented by Ic1 and Ic2. Transistor pairs M1–M3 and M2–M4 produce feedback currents Ic12 and Ic11 mirrored from currents Ic1 and Ic2 respectively and feed them back into respective current mirror transistors Q12 and Q11. Feedback currents Ic12 and Ic11 are then mirrored by diode-connected current mirror transistor pair Q12 and Q11 and fed into transistor pair Q4 and Q3 respectively. These latter two transistor pairs act like current sources for the input differential transistor pairs and also operate as negative feedback transistors for the transconductance currents Ic1 and Ic2. The negative feedback without intermediate conversion from current to voltage improves the linearity of the transconductance cell. In addition, as mentioned above, the circuit of FIG. 4 includes no series base-emitter junctions which cause unnecessary voltage drops. There is only one base-emitter junction at Q3 in FIG. 4 and as a consequence, it can operate at a lower supply voltage. FIG. 4 illustrates also a biasing circuit for the transconductance core which sets the point of differential operation. As seen in the Figure, the bias is provided by M5 and M6 which forces four equal currents Ic1, Ic2, Ic11 and Ic12. The bias transistors M5 and M6 are commonly biased from the port Vbias. Transistors Q5 and Q6 sense a differential current represented by Ic5 and Ic6 and then amplify this into a differential current represented by Ic5 and Ic6. The resistors Rc1 and Rc2 convert the differential current represented by Ic5 and Ic6 into a differential voltage at the output ports Out+ and Out−. The resistors Rc1 and Rc2 and Re as well as the emitter area ratios of Q5/Q11 and Q6/Q12 are chosen to achieve the required gain value.

Figure 5:
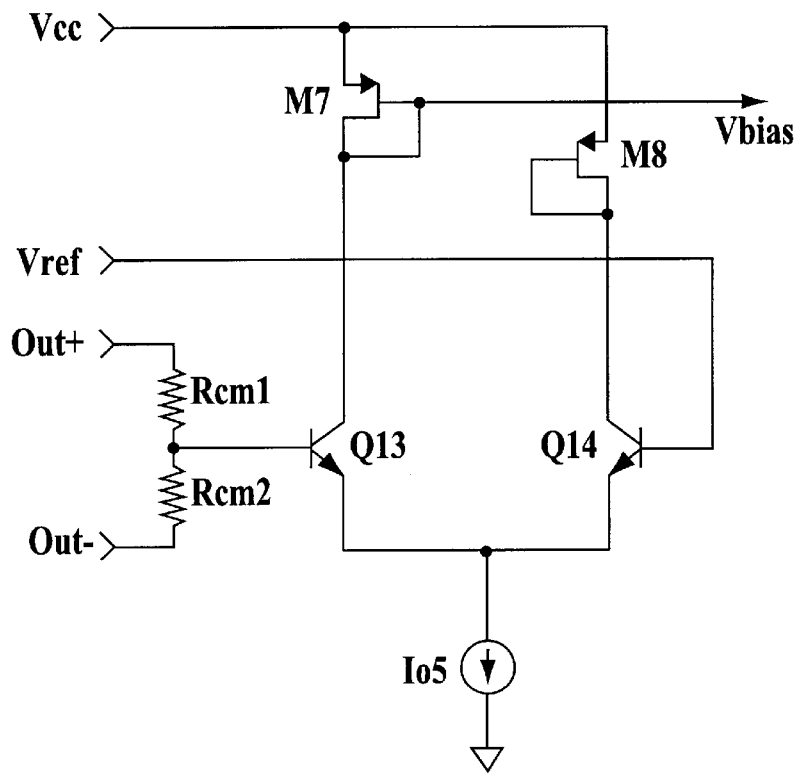
FIG. 5 is a schematic diagram of a common mode feedback circuit in accordance with one embodiment of the invention.

FIG. 5 is a schematic diagram of a common mode feedback circuit. This circuit provides the bias voltage for the transconductance cell shown in FIG. 4. The differential pair represented by transistors Q13 and Q14 compares a reference voltage present at port Vref with a common mode voltage. The common mode voltage is obtained from the two voltages present at ports Out+ and Out− that are connected through resistors Rcm1 and Rcm2. The middle point between the resistors exhibits a common mode voltage that equals the average DC voltage of the signals Out+ and Out−. Any difference between the common mode voltage and the reference voltage is amplified by the differential pair and transferred to the loads represented by transistors M7 and M8. The bias voltage that results from the process of comparison and amplification is presented at port Vbias.

Figure 6:
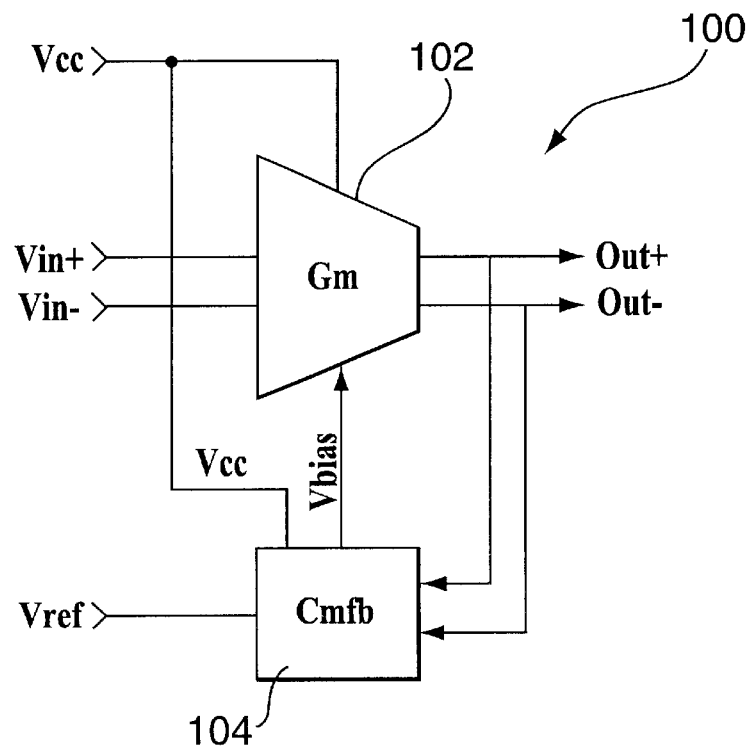
FIG. 6 is a block diagram of a Gm cell.

FIG. 6 shows a block diagram for a Gm cell 100 illustrating this embodiment with a transconductance cell 102 and a common mode feedback circuit 104. The output ports of the transconductance cell 102 are connected to the ports Out+ and Out− in the common mode feedback circuit, and the Vbias port in the common mode feedback circuit drives the Vbias port of the transconductance cell 102.

Figure 7:
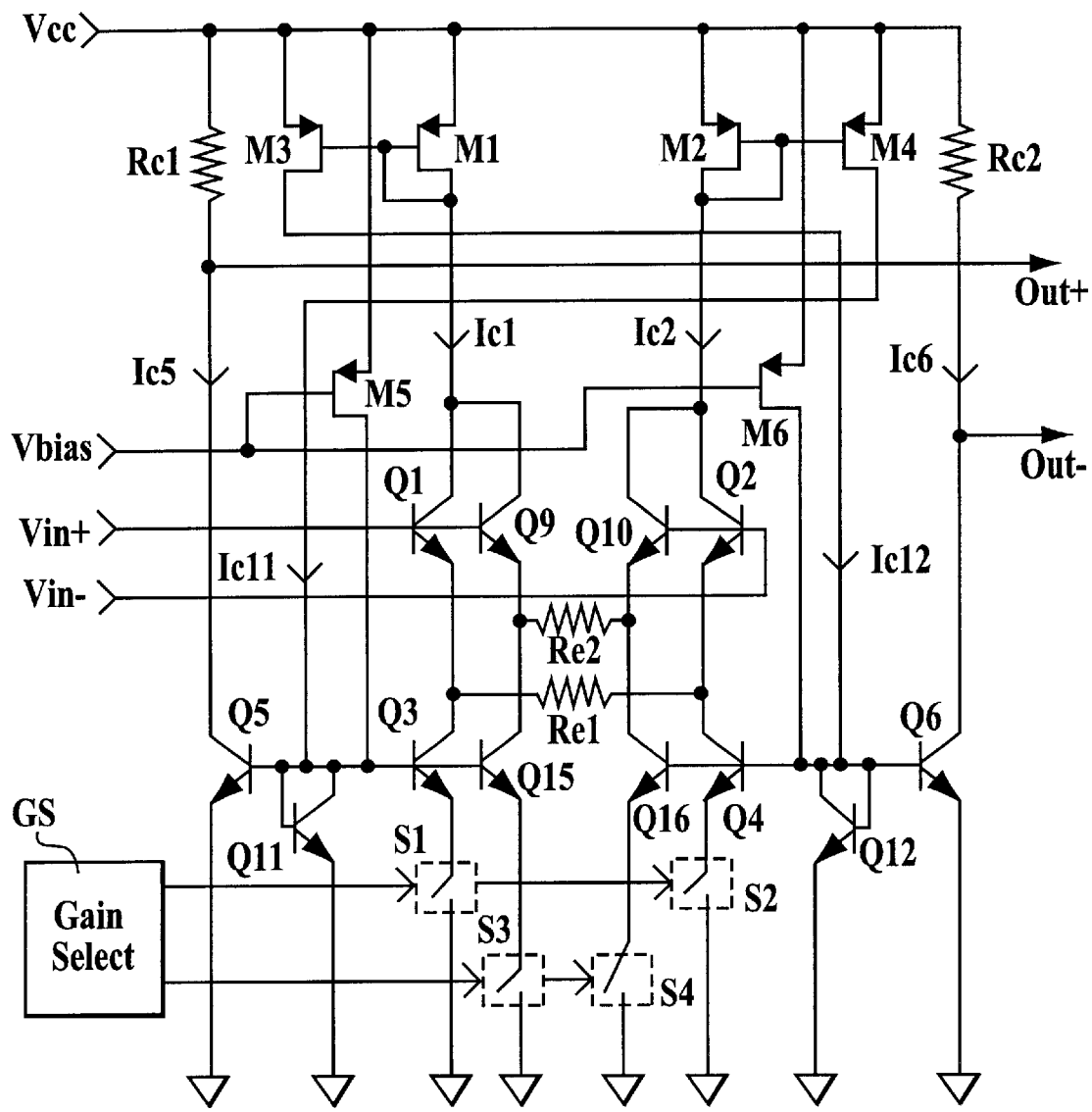
FIG. 7 is a schematic diagram showing a variable-gain Gm cell.

Another preferred embodiment of the invention is illustrated in FIG. 7. In addition to input differential pair transistors Q1/Q2 and their current source transistors Q3/Q4 and degeneration resistor Re1, a second input differential pair Q9/Q10 is connected in parallel with Q1/Q2, and it has its own separate current source transistors Q15/Q16 and degeneration resistor Re2. Additionally, four switches S1, S2, S3, and S4 are placed in the emitters of respective current source transistors Q3, Q4, Q15, and Q16. These switches are controlled in pairs by a gain select block GS: typically, either S1 and S2 are closed while S3 and S4 are open, or S3 and S4 are closed while S1 and S2 are open. The current source transistors connected to the closed switches are enabled, while those connected to the open switches are disabled. This, in turn, enables or disables the corresponding input differential pair. By choosing different values for Re1 and Re2, and/or different emitter areas for current source transistors Q3/Q4 versus Q15/Q16, two different gains can be realized. The gain select block can therefore open and close the switches to control the gain of the overall Gm cell. Because the gain of this cell can vary, the cell is called a variable-gain Gm cell.

Figure 8:
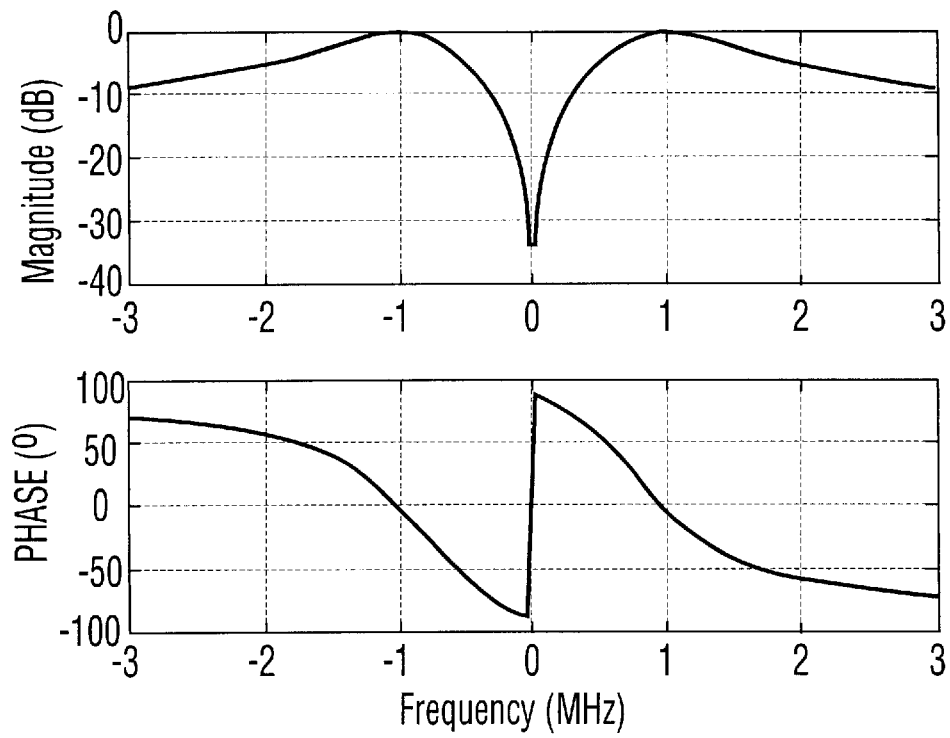
FIG. 8 is a graph showing the frequency response of a real band pass filter.
Figure 9:
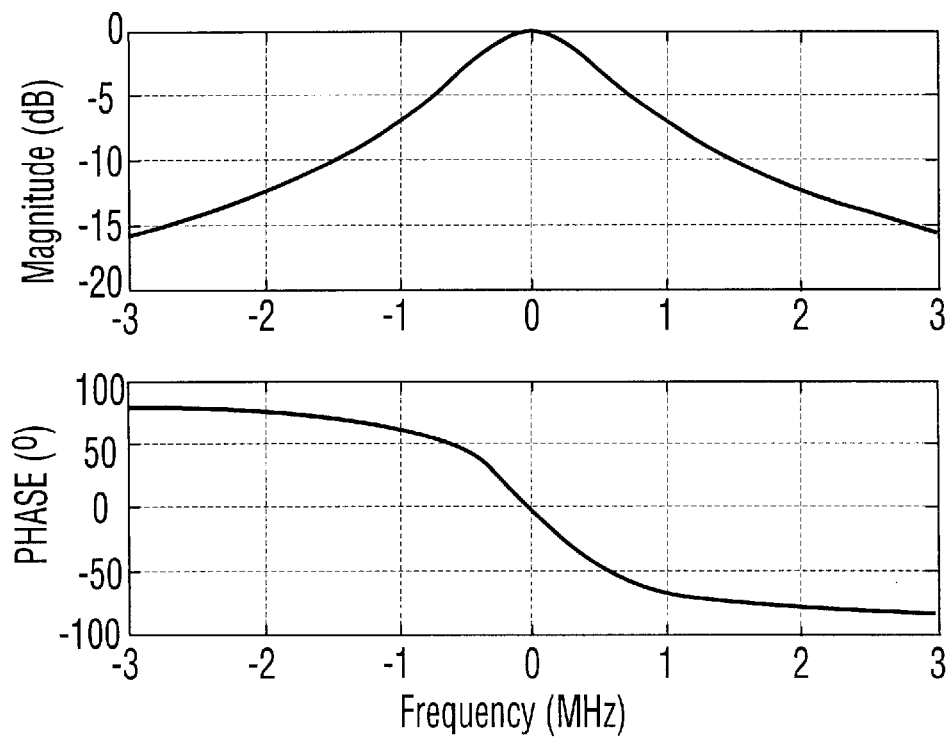
FIG. 9 is a graph showing the frequency response of a real low pass filter.
Figure 10:
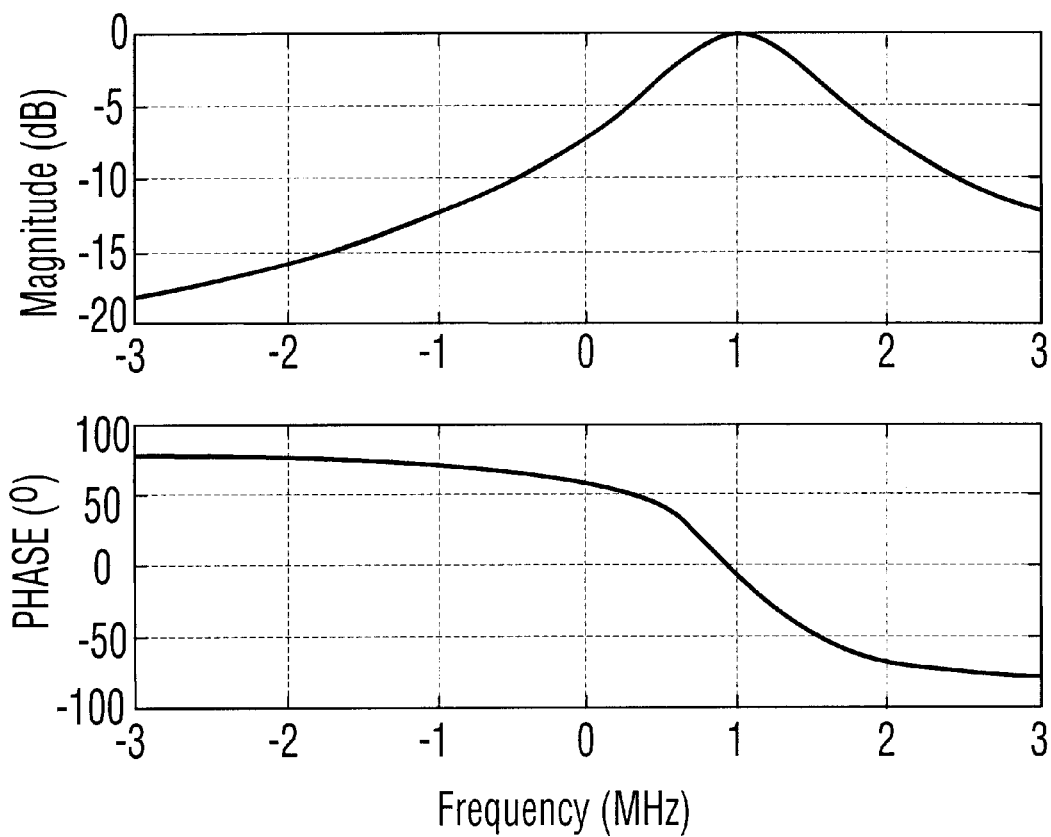
FIG. 10 is a graph showing the frequency response of a complex band pass filter.

In the above two embodiments the Gm cell can be used in the creation of an intermediate frequency (IF) processing stage of a low power, low voltage wireless receiver. To reduce power consumption, it is beneficial to choose an IF that is as low as possible. The circuitry inside the IF operates at this low frequency, and circuits operating at a low frequency generally use less power than those that operate at a high frequency. As mentioned in the background section, signal filtering is one essential component of an IF processing stage. The circuitry that performs this filtering implements a band pass frequency response, which passes the band of frequencies centered at the desired signal frequency and attenuates frequencies outside this band, thereby selecting the desired signal. In a wireless receiver in which the desired signal has an in-phase (I) and quadrature (Q) component, low-IF receivers can suffer from the following problem. FIG. 8 depicts the magnitude and phase response of a band pass filter with a 3 dB bandwidth of 1 MHz and a transfer function of $$H_{BP}(s) = \frac{s/\omega_0}{s^2/\omega_0^2 + s/\omega_0 + 1} \quad (1)$$

where s is the complex frequency of the signal and $\omega_0 = 2\pi \cdot 1$ MHz. This filter would be useful in a system with an IF of 1 MHz: it passes the band of frequencies centered at 1 MHz. However, it also passes the band centered at −1 MHz. Being only 2 MHz away from the IF, this band likely contains an interfering signal, and this signal is passed through the filter with no attenuation. Rather than a real filter, which has a symmetric response (with a phase inversion) at positive and negative frequencies, a low-IF wireless receiver requires a complex band pass filter, which passes only the positive IF frequency. Such a filter is constructed by starting with a low pass filter transfer function $$H_{LP}(s) = \frac{1}{s/\omega_0 + 1} \quad (2)$$

which is plotted in FIG. 9 for $\omega_0 = 2\pi \cdot 500$ kHz. By applying the transformation $$j\omega \rightarrow j\omega - j\omega_c, \quad (3)$$

where $\omega_c = 2\pi \cdot 1$ MHz is the center frequency of the new response, the transfer function $$H_{LPC}(s) = H_{LPC}(j\omega) = \frac{1}{(j\omega - j\omega_c)/\omega_0 + 1} \quad (4)$$

depicted in FIG. 10 is obtained. $H_{LPC}(s)$ has the desired frequency response: the bandwidth is 1 MHz centered at 1 MHz, and an interfering signal at −1 MHz is attenuated the same amount as one at 3 MHz. Comparing FIG. 9 to FIG. 10, it is apparent that the low pass response has simply been shifted from a center frequency of 0 Hz (the real filter) to 1 MHz (the complex filter).

Figure 11:
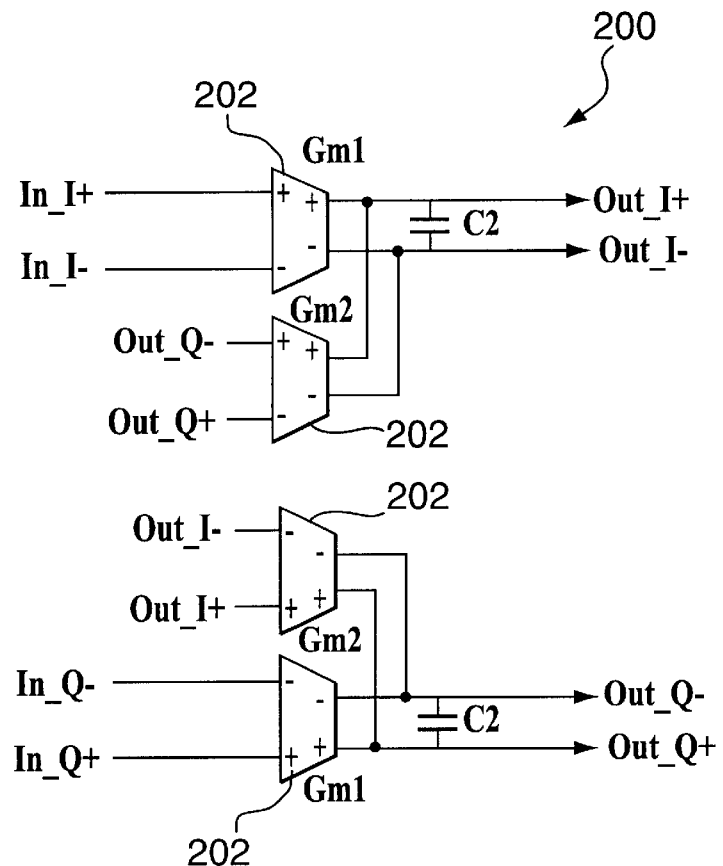
FIG. 11 is a block diagram showing a single complex pole filter.

The transfer function of (4) assumes a complex input signal $x = x_R + j_c$ and a corresponding complex output signal y, $H_{LPC}(s) = y/x$. A practical embodiment of this principle appears in FIG. 11. This is a complex filter stage 200 which makes use of the present invention, wherein four Gm cells 202 are coupled in a feedback structure. The complex signal is present at I and Q ports as differential voltages, In_I+ and In_I− for the I path and In_Q+ and In_Q− for the Q path. The two Gm cells labeled Gm1 drive these input voltages into capacitors C2 connected to the output ports, Out_I+ and Out_I− for the I path and Out_Q+ and Out_Q− for the Q path. Two Gm cells labeled Gm2 also drive capacitors C2, but their inputs come from the outputs of the opposite path: Gm2 cell which drives capacitor C2 in the I path is itself driven by the Q path outputs, and vice versa for Gm2 cell driving capacitor C2 in the Q path. Moreover, there is a phase inversion at the inputs of Gm2 cell which drives the I path: Out_Q− drives the positive input port of this Gm2 cell and Out_Q+ drives the negative input port. No phase inversion is applied to the inputs of Gm2 cell which drives the Q path. The equations for the output port voltages are found to be $$v_{Iout} = \frac{(sC/g_1 + 1/g_1 R)v_{Iin} - (g_2/g_1)v_{Qin}}{(sC/g_1 + 1/g_1 R)^2 + g_2^2/g_1^2}, \quad (5)$$

-continued $$v_{Qout} = \frac{(sC/g_1 + 1/g_1 R)v_{Qin} + (g_2/g_1)v_{Iin}}{(sC/g_1 + 1/g_1 R)^2 + g_2^2/g_1^2} \quad (6)$$

where C is the value of C2 capacitor, R is the collector resistance value (Rc1 and Rc2 in FIG. 4), and $g_1$ and $g_2$ are, respectively, the realized transconductance values of Gm1 and Gm2 cells. If $v_{Iin}=1$ and $v_{Qin}=j$ (i.e., if the Q input leads the I input by 90°, as is customarily the case), then by appropriate choice of the $g_1$, $g_2$, R, and C parameters, the $v_{Iout}$ transfer function will appear as in FIG. 10. The $v_{Qout}$ transfer function will be the same as that for $v_{Iout}$, only its phase will lead that of $v_{Iout}$ by 90°.

Figure 12:
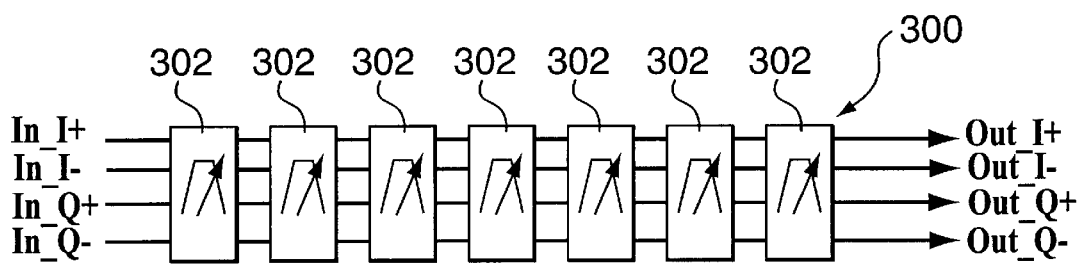
FIG. 12 is a block diagram of a complex 7-pole filter in a cascaded structure.
Figure 13:
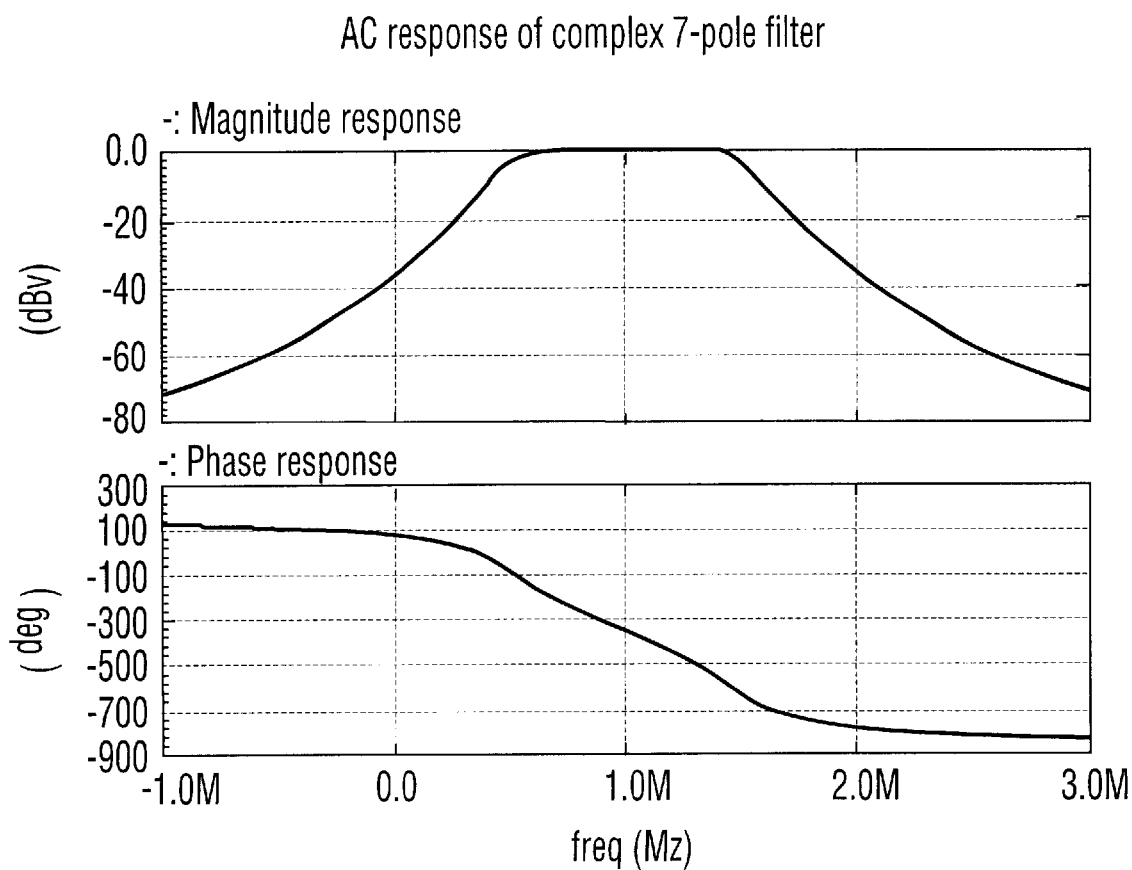
FIG. 13 is the AC response of complex 7-pole filter.

A practical low-IF wireless receiver often requires more than one stage of filtering to ensure that interfering signals are attenuated sufficiently before demodulation of the desired signal. FIG. 12 shows a practical embodiment of a multi-stage complex filter 300 with seven cascaded complex filter stages 302. Out_I+ and Out_I− output ports of one stage are connected to In_I+ and In_I− input ports of the following stage, and similarly for the Q path ports. An example plot of the I path filter output response to quadrature I and Q path inputs is depicted in FIG. 13. In this plot, the complex filter stage parameters have been chosen such that the realized transfer function is a cascade of two standard filters: a 3-pole Butterworth filter with a (complex) center frequency of 1 MHz and a 3 dB frequency of 500 kHz, and a 4-pole Butterworth filter with the same center and 3 dB frequencies. In addition to several poles, a practical low-IF receiver often requires amplification to boost the power of the desired signals to easily detectable levels. The embodiment of FIG. 12 can provide this amplification by interposing variable-gain amplifiers of FIG. 7 between the filter poles at appropriate points.

Figure 14:
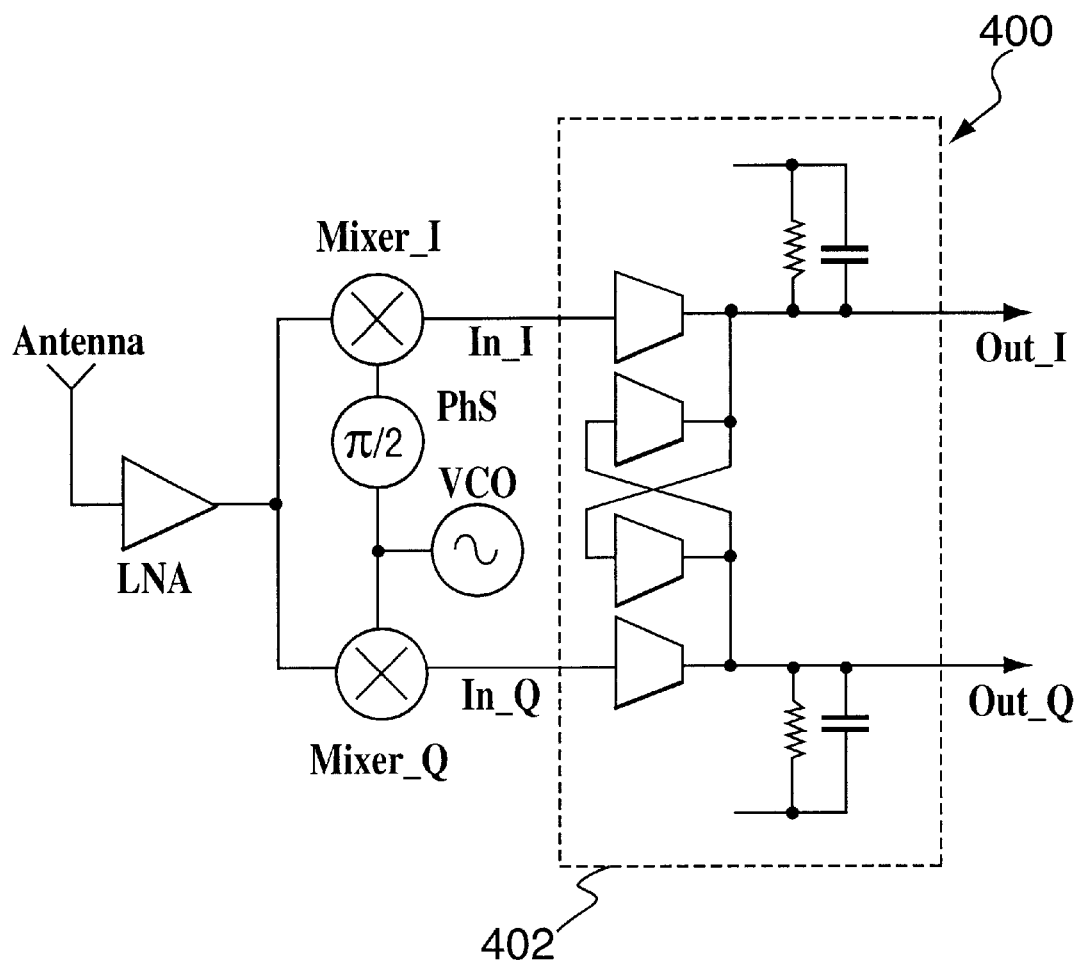
FIG. 14 is a block diagram showing a communication system in accordance with an embodiment of the present invention.

Finally, FIG. 14 is a block diagram showing one possible communication system 400 in accordance with an embodiment of the present invention. In the embodiment shown, the incoming radio frequency (RF) signals are received by an antenna and amplified by a low noise amplifier (LNA). Balanced mixers Mixer_I and Mixer_Q use the signal coming from a local voltage controlled oscillator (VCO) and combine it with the signal coming from LNA. Between Mixer_I and VCO is interposed a 90° phase shifter PhS and therefore the two mixers are excited by two VCO signals in quadrature. The resulting output signal from mixers In_I and In_Q feeds the complex filter stage 402 that filters unwanted signals (and possibly amplifies the desired signal with variable-gain amplifiers) and presents the output signals at the ports Out_I and Out_Q.

What is claimed is:

1. A low voltage transconductance cell having a high linearity, comprising:
    a transconductance core for differential inputs and differential outputs;
    current sources for providing operational currents for the transconductance core;
    current mirror circuits connected to the transconductance core for generating a pair of mirrored feedback currents to be fed back to the current sources;
    a bias circuit for setting an operational point of the transconductance core, and
    a common mode feedback circuit connected to the outputs of the transconductance core for generating a bias signal to be applied to the bias circuit, the common mode feedback circuit including an averaging circuit for averaging the differential outputs and a comparing circuit for comparing an average of the differential outputs with a reference value to generate the bias signal.

2. The low voltage transconductance cell according to claim 1 further comprising a plurality of transconductance cores, each having a different gain setting, and a gain select mechanism for selecting one of the plurality of transconductance cores.

3. A low voltage transconductance cell having a high linearity, comprising:
    a differential amplifier stage including a non-inverting section and an inverting section, the non-inverting section having a non-inverting input and a non-inverting output and the inverting section having an inverting input and an inverting output;
    first and second current sources generating a current flow through the non-inverting section and the inverting section respectively;
    first current mirror and a second current mirror circuits connected to the non-inverting and inverting sections respectively, the first current mirror circuit sensing the current in the non-inverting section and generating a first mirror current to feed back to the second current source, and the second current mirror circuit sensing the current in the inverting section and generating a second mirror current to feed back to the first current source.

4. The low voltage transconductance cell according to claim 3, further comprising a bias circuit for setting an operational point of the differential amplifier stage and a common mode feedback circuit for generating a bias signal to be applied to the bias signal.

5. The low voltage transconductance cell according to claim 4 wherein the common mode feedback circuit comprises an averaging circuit for averaging the non-inverting and inverting outputs and a comparing circuit for comparing an average of the non-inverting and inverting outputs with a reference value to generate the bias signal.

6. The low voltage transconductance cell according to claim 3 wherein the differential amplifier stage comprises a transconductance core of two transistors and a degeneration resistor connected between the transistors.

7. The low voltage transconductance cell according to claim 6 wherein the differential amplifier stage having two or more transconductance cores, each having a different gain setting, the low voltage transconductance cell further comprises a gain select mechanism for selecting one of the plurality of transconductance cores.

8. The low voltage filter transconductance cell according to claim 3, wherein further each of the first and second current mirror circuits comprises a pair of transistors connected between a power supply and the respective section of the differential amplifier stage.

* * * * *